United States Patent [19]

Groeneveld et al.

[11] Patent Number: 5,021,784

[45] Date of Patent: Jun. 4, 1991

[54] CALIBRATED CURRENT SOURCE WITH RIPPLE REDUCTION

[75] Inventors: Dirk W. J. Groeneveld; Hendrikus J. Schouwenaars, both of Eindhoven, Netherlands

[73] Assignee: U. S. Philips Corporation, New York, N.Y.

[21] Appl. No.: 547,901

[22] Filed: Jul. 2, 1990

[30] Foreign Application Priority Data

Jul. 10, 1989 [NL] Netherlands .................. 8901755

[51] Int. Cl.$^5$ ........................................... H03M 1/10
[52] U.S. Cl. .................................. 341/120; 341/118; 341/136
[58] Field of Search ............... 341/118, 120, 136, 144, 341/153, 154

[56] References Cited

U.S. PATENT DOCUMENTS

| | | | |
|---|---|---|---|
| 4,272,760 | 6/1981 | Prazak et al. | 341/118 |
| 4,549,166 | 10/1985 | Hotta et al. | 341/118 |
| 4,591,828 | 5/1986 | Storey | 341/136 |
| 4,607,250 | 8/1986 | Naylor et al. | 341/118 |
| 4,914,440 | 4/1990 | Ramet | 341/144 X |
| 4,935,740 | 6/1990 | Schouwenhaars et al. | 341/144 X |
| 4,958,155 | 9/1990 | Gulczynski | 341/120 |
| 4,967,140 | 10/1990 | Groeneveld et al. | 323/315 |

OTHER PUBLICATIONS

IEEE International Solid State Circuits Conference, 15 Feb. 1989, "Data Converters" Groeneveld et al., pp. 22, 23 and 277.

*Primary Examiner*—J. R. Scott
*Assistant Examiner*—H. L. Williams
*Attorney, Agent, or Firm*—Bernard Franzblau

[57] ABSTRACT

A signal source arrangement includes a group of signal sources calibrated so that each signal source produces an identical unit signal. The unit signals are combined to form the output signal. Each signal source also produces a similar undesirable spurious signal caused by the calibration procedure. The combination sequence or the calibration sequence is arranged so as to minimize the undesirable effect of the resulting spurious signals in the combined output signal.

12 Claims, 8 Drawing Sheets

CALIBRATED CURRENT SOURCE WITH RIPPLE REDUCTION

BACKGROUND OF THE INVENTION

The invention relates to a signal-source arrangement comprising a group of signal sources for generating substantially identical unit signals correction means for reducing mutual deviations in the unit signals from the signal sources by calibrating the signal sources in conformity with a calibration pattern recurring at a specific period, resulting in unit signals comprising similarly shaped spurious signals recurring at said period, and combination means for combining a number of unit signals of the available unit signals to form an output signal.

The invention also relates to a digital-to-analog converter comprising such a signal-source arrangement. In the appended claims and the description, "signal source" is to be understood to mean both a voltage source and a current source, so that the corresponding signals should be regarded as voltages and currents respectively.

An arrangement of the type defined in the opening paragraph is known from "A Self Calibration Technique for Monolithic High-Resolution D/A Converters", Digest of Technical Papers, 1989 IEEE International Solid-State Circuits Conference (ISSCC '89), pp. 22-23, February 1989. This known arrangement comprises a group of substantially identical current sources. The current sources each supply a unit current formed by the source-drain current of a MOS transistor. The magnitude of the source-drain current is dictated by a control voltage between the gate and the source of the MOS transistor. Combination means enable the unit currents to be combined in order to form one or more output currents which are multiples of the unit current. This is the case, for example, in a digital-to-analog converter in which the output currents are derived from the unit currents in conformity with a binary-ascending series.

As a result of the spread in transistor parameters, the unit currents supplied by the MOS transistors are never perfectly equal to each other. This imposes a limitation on the accuracy of a digital-to-analog converter comprising such current sources. In the known current-source arrangement the equality of the current sources is improved in that the current sources are recalibrated continually by correction means. By means of a control circuit the control voltage across a capacitor arranged between the gate and source of the MOS transistor is then controlled in such a way that the source-drain current is equal to a reference current. When all the current sources have been calibrated the cycle is repeated. By means of this calibration method it is possible to obtain a group of current sources which are identical to each other with a very high accuracy. However, a consequence of the method is that the control voltage between the gate and the source of the MOS transistors does not remain constant between two consecutive calibration cycles as a result of charge leakage of the capacitor between the gate and source electrodes of the MOS transistors. This gives rise to a ripple on the control voltage so that the unit currents may also exhibit ripple components. Moreover, other spurious signals may arise as a result of calibration. For example, the alternate turn-on and turn-off of each of the current sources by means of the control circuit is attended by switching transients on the gates of the MOS transistors, which give rise to a spurious signal in the drain-source current. Therefore, calibration results in all of the unit currents exhibiting a substantially similar spurious signal having a period corresponding to the duration of one calibration cycle.

When the unit currents are combined to form larger output currents, the spurious signals cumulate. The accumulation of the spurious signals restricts the accuracy of the output currents, which in the case of a digital-to-analog converter results in a reduced accuracy and dynamic range.

SUMMARY OF THE INVENTION

It is an object of the invention to provide a signal-source arrangement comprising means for minimizing the influence of the spurious signals.

According to the invention a signal-source arrangement of the type defined in the opening paragraph is therefore characterized in that at least one of the correction means and the combination means is adapted to select unit signals for the output signal in such a way that relative to the spurious signal of one of the selected unit signals the spurious signals of the selected unit signals exhibit time shifts whose average value as closely as possible approximates to half the period and whose abolute values differ from each other to a maximal extent.

On account of the calibration sequence and/or the combination sequence of the calibrated signal sources the resulting spurious signals in the output signals will have a minimal amplitude, or a repetition rate which is a multiple of the calibration frequency, or a combination of these two possibilities. Thus, an improved spurious signal suppression and hence more accurate output signals can be obtained by the same means. When filters are employed for the rejection of spurious signals in the output signals the filters can be simplified or may even be dispensed with.

BRIEF DESCRIPTION OF THE DRAWING

The invention will now be described in more detail, by way of example, with reference to the accompanying drawings, in which.

DESCRIPTION OF THE PREFERRED EMBODIMENTS

Figure 1:
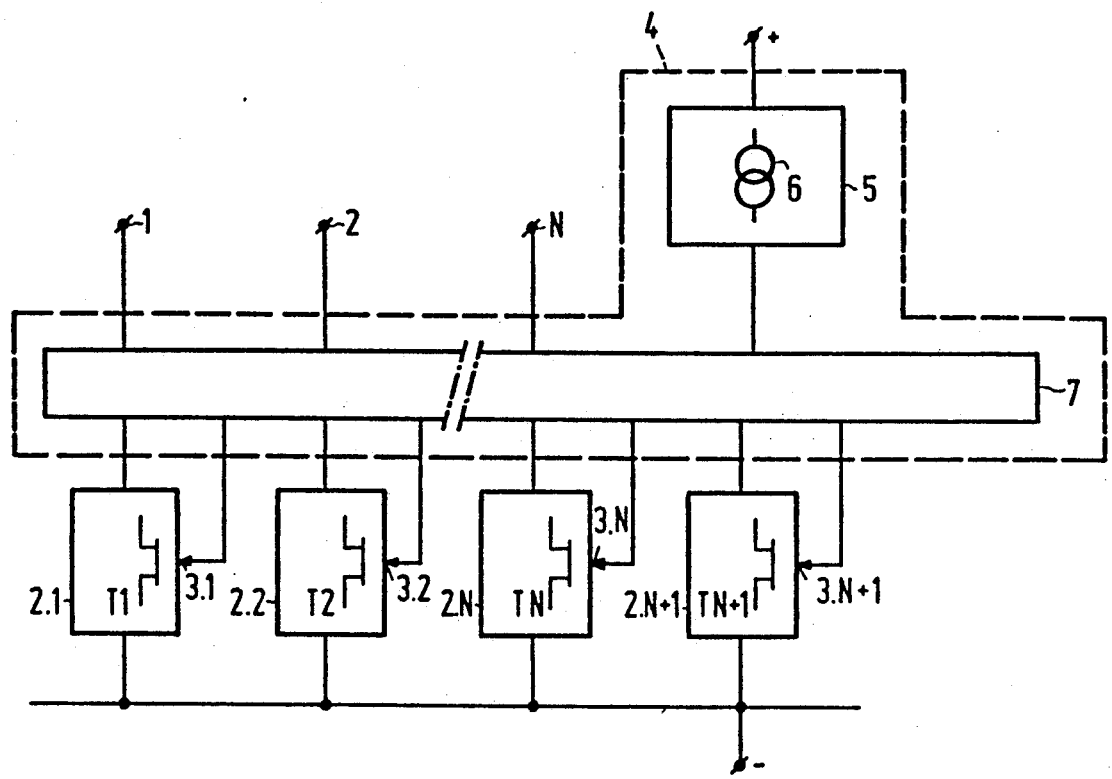
FIG. 1 shows the basic diagram of a current-source arrangement comprising calibrated current sources.

FIG. 1 shows a basic diagram of a current-source arrangement comprising calibrated current sources. The arrangement is constructed to supply N substantially identical unit currents at outputs 1 to N, to which loads, which are not shown for simplicity, can be connected. The arrangement comprises N+1 current sources 2.1 to 2.N+1, which comprise transistors T1 to T.N+1. The current sources have control inputs 3.1 to 3.N+1 for controlling the drive voltage and hence the current in the transistors T.1 to T.N+1. The arrangement further comprises correction means 4 comprising a correction circuit 5, including a reference-current source 6 for supplying a control signal to one of the control inputs 3.1 to 3.N+1 and further comprising a switching network 7 for coupling, one at a time, each of the current sources 2.1 to 2.N+1 to the correction circuit 5, and for coupling the other current sources to the outputs 1 . . . N in conformity with a cyclic pattern.

In this arrangement in every period of a cycle, N current sources supply the output currents to the outputs 1 to N, the remaining current source being coupled to the correction circuit 5. In this correction circuit the current from a selected current source is compared with the reference current from the source 6 and a control is applied to the control input 3 of the selected current source by the correction circuit 5. The control signal controls the drive voltage of the relevant transistor 2 in such a way that the current from the selected current source becomes equal to the reference current. In the next period of the cycle the corrected current source 2 is replaced with an uncorrected current source 2 by means of the switching network 7. In this way the currents from all of the current sources 2.1 to 2.N+1 are corrected successively and continually. As a result, the currents at the outputs 1 to N are accurately equalized to the reference current. Since a signal source to be corrected is disconnected from the actual current-source arrangement, the correction circuit 5 will not disturb the operation of the current-source arrangement. The unit currents at the outputs 1 to N remain available continously.

Figure 2:
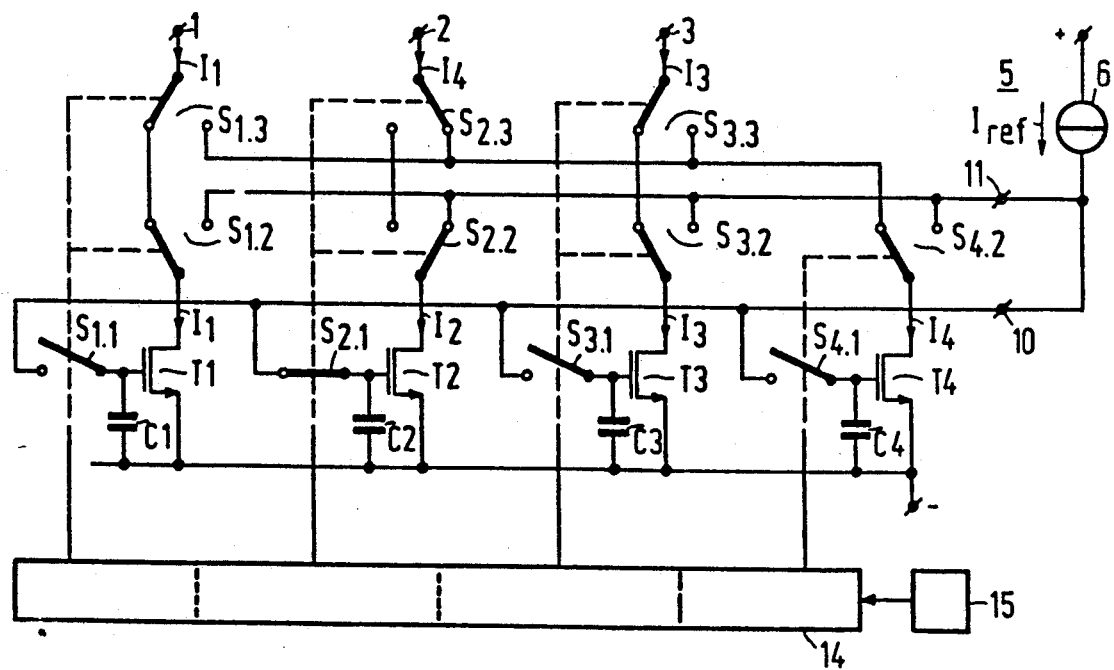
FIG. 2 is the circuit diagram of an embodiment of a current-source arrangement comprising calibrated current sources.

FIG. 2 shows an embodiment of a calibrated current-source arrangement in greater detail. The arrangement comprises four current sources constituted by the transistors T1 to T4 with capacitors C1 to C4 arranged between the respective gate and source electrodes. By means of the switches S1.1 to S4.1, S1.2 to S4.2 and S1.3 to S3.3, each time three of the four transistors T1 to T4 can be coupled to the outputs 1, 2 and 3 and the remaining transistor is coupled to the inputs 10 and 11 of the correction circuit 5. Said switches are controlled in a cyclic pattern, in the present example by means of a shift register 14 under the control of a clock 15.

The Figure illustrates the situation in which the drain-source currents I1, I3 and I4 of the transistors T1, T3 and T4 are applied to the outputs 1, 3 and 2 while the drain-source current I2 of the transistor T2 is applied to the input 11 of the correction circuit 5. The switches S1.1, S3.1 and S4.1 are open while the switch S2.1 is closed, so that the gate electrode of the transistor T2 is coupled to the input 10. In the present example the correction circuit comprises a reference current source 6, which supplies a current Iref to the interconnected inputs 10 and 11.

As a result of this direct connection between the inputs 10 and 11 the drain of the transistor T2 is connected to its gate. The current source 6 now controls the voltage on the capacitor C2 in such a way that the current I2 is accurately equalized to the reference current Iref. In the next clock period the transistor T2 is connected to the output 2 by means of the switches S2.2 and S2.3 and the switch S2.1 is opened. The voltage on the capacitor C2 therefore remains available so that the current I2 in the transistor T2 remains accurately equal to the current Iref. In the same clock period one of the other three transistors, for example, the transistor T3, is connected to the inputs 10 and 11 of the correction circuit and the control voltage on the capacitor C3 is adapted in such a way that the current I3 becomes accurately equal to the current Iref. In this way the currents I1 to I4 from the transistors T1 to T4 are successively and continually equalized to the current Iref. As a result, currents which are accurately equal to each other will appear at the outputs 1, 2 and 3.

Figure 3A:
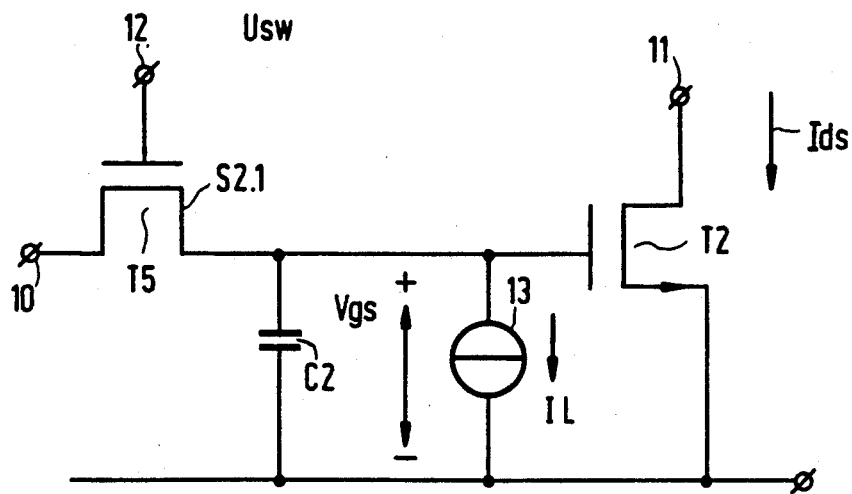
FIGS. 3a-3c show a calibrated current source and the associated spurious-signal waveforms.
Figure 3B:
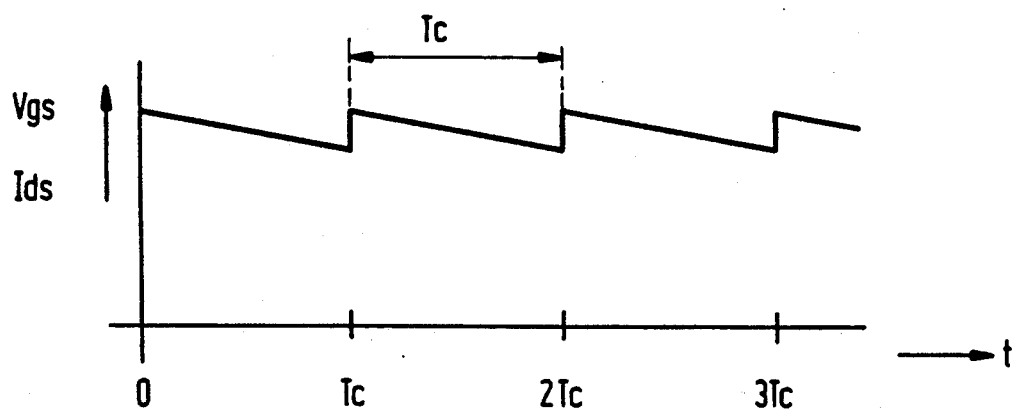

FIG. 3a shows a suitable example of one of the calibrated current sources in the arrangement shown in FIG. 2, like parts bearing the same reference numerals. The switch S2.1 is constructed as a transistor T5 whose gate 12 is controlled in a suitable manner by means of a switching signal Usw from the shift register 14. A current source 13, representing a leakage current IL, is shown in parallel with the capacitor C2. The leakage current IL is caused inter alia, by the reverse source-substrate diode of the transistor T2. The presence of the leakage current causes the gate-source voltage Vgs of T2 to decrease between two calibration cycles. This is illustrated in FIG. 3b, in which Tc is the period of the calibration cycle. This gives rise to a ripple-voltage component on the gate-source voltage Vgs of the transistor T2 of the order of magnitude of a few mV, which is converted substantially linearly into a similar ripple in the drain-source current Ids of the transistor T2.

Figure 3C:
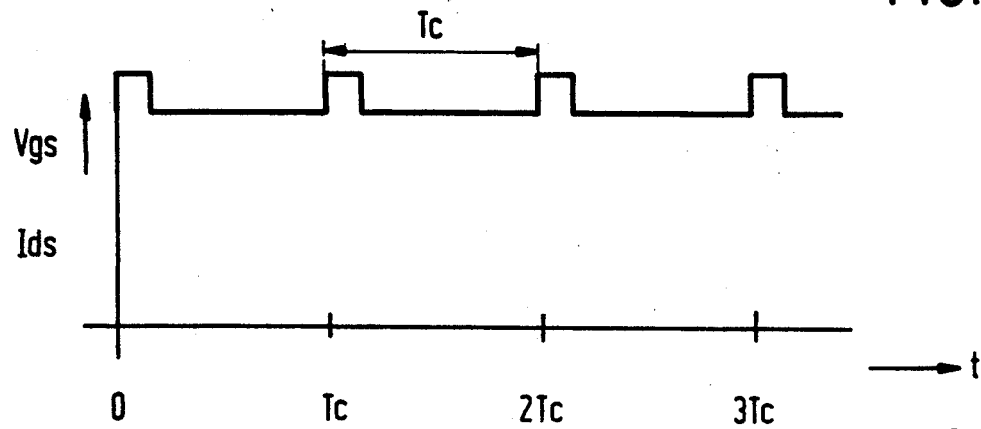

The switching signal Usw, which connects and disconnects the current source T2 to be calibrated to/from the correction means, can also affect the gate-source voltage Vgs and hence the drain-source current Ids of the transistor T2 as a result of, for example, capacitive crosstalk. FIG. 3c by way of example shows a possible signal waveform, which may have a different shape in practice. FIGS. 3b and 3c, shows that the unit currents Ids from the individual calibrated current sources comprise a spurious signal caused by the calibration process itself and having a period equal to the period Tc of the calibration cycle. The signal waveform of the spurious signal may be a mixture of the waveforms given in FIGS. 3b and 3c, but in practice the spurious signal may have a different waveform.

Figure 4A:
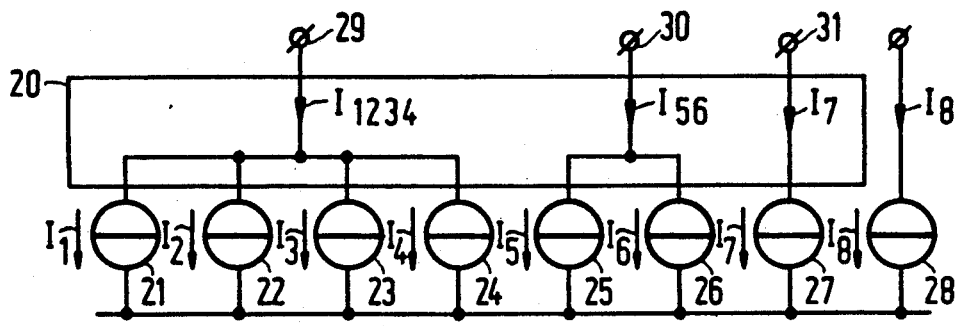
FIGS. 4a-4c show combined calibrated current sources and associated spurious-signal waveforms.

The calibrated current sources 2.1 to 2.N in the current-source arrangement shown in FIG. 1 can be used for various purposes. It is common practice to use the unit currents I from the individual current sources 2 . . . 2.N in order to combine them so as to obtain larger output currents. In a digital-to-analog converter this combination is effected in such a way that the output currents form a binary ascending series. When I is the unit current, the first output current is then I, the second output current is 2I, the third is 4I, the fourth is 8I etc. FIG. 4a shows a calibrated current-source arrangement for use in a 3-bit digital-to-analog converter, in which for simplicity all of the circuit elements discussed so far are symbolized by eight current sources 21 to 28, all having an intensity I and being calibrated in the sequence 21, 22, ..., 28, yielding eight equal unit currents I1 to I8. The unit currents I1, I2, I3 and I4 are combined in combination means 20, shown diagrammatically, to form an output current I1234 available at the terminal 29. The unit currents I5 and I6 are combined to form an output current I56 at terminal 30, the unit current I7 being applied directly to the terminal 31. By means of switches, not shown, the currents I1234, I56 and I7 are summed under control of a digital input signal to form an analog output current.

Figure 4B:
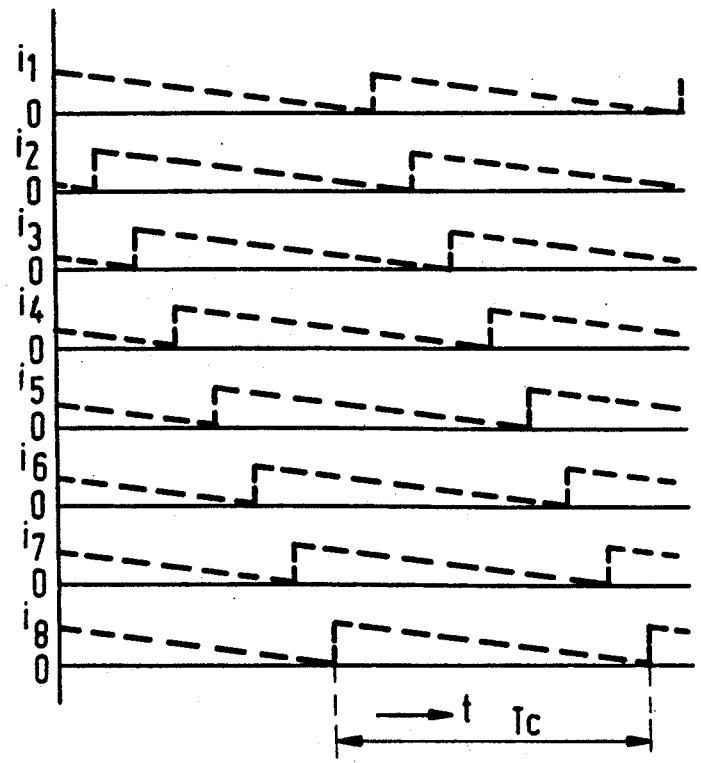
Figure 4C:
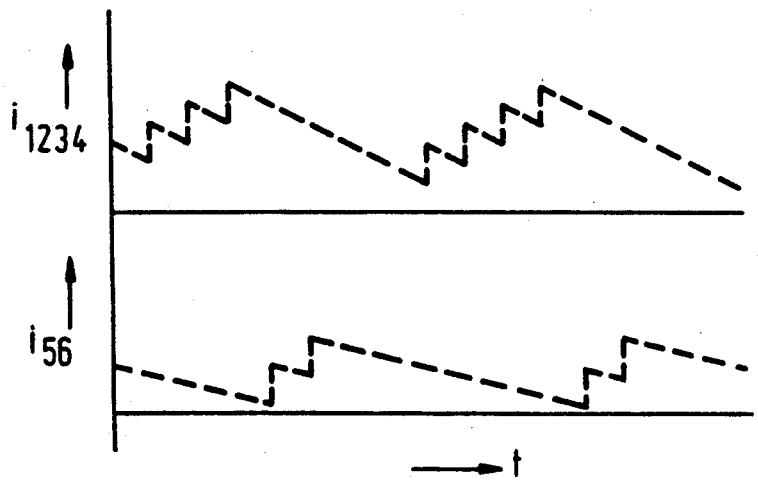

FIG. 4b gives the spurious signals i1 to i8 resulting from the leakage current in the current sources 21 to 28. FIG. 4c shows resulting spurious signals i1234 and i56 in the output currents I1234 and I56, respectively. The amplitudes of the spurious signals have increased relative to those of the spurious signals i1 to i8.

Figure 5A:
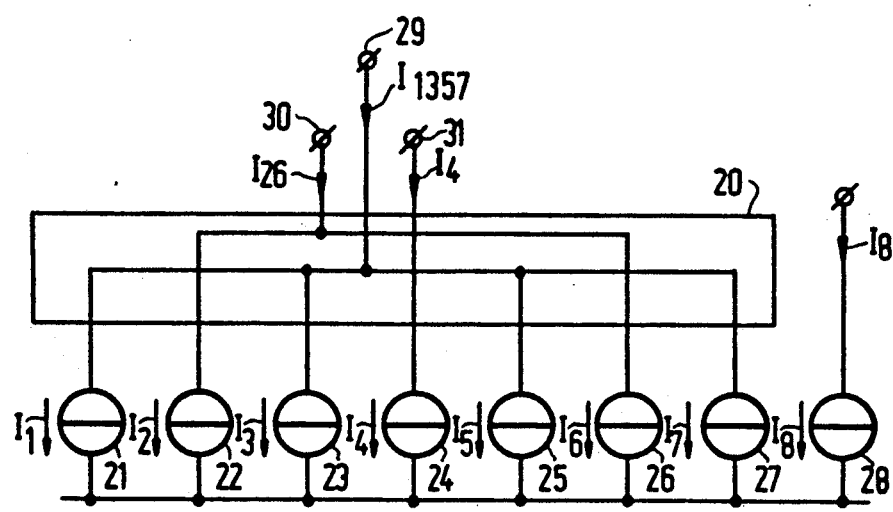
FIGS. 5a-5c show calibrated current sources arranged in accordance with the invention and the associated spurious-signal waveforms.
Figure 5B:
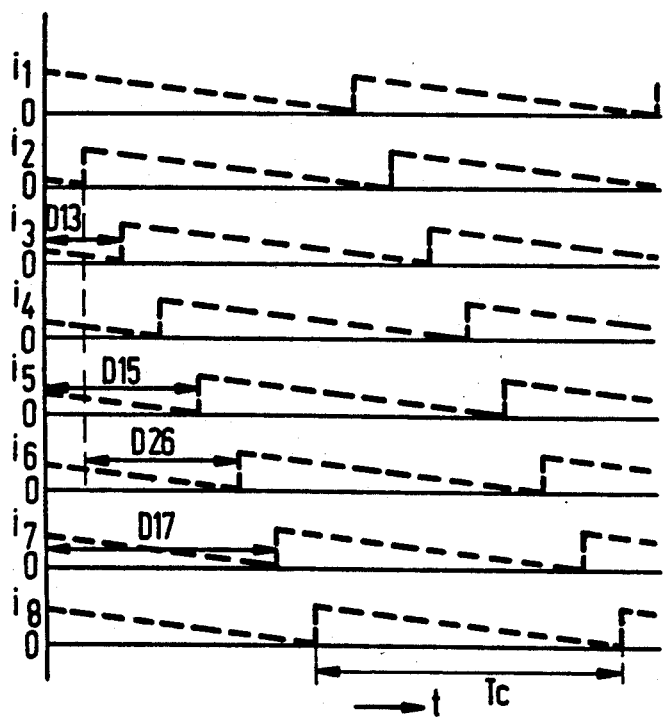
Figure 5C:
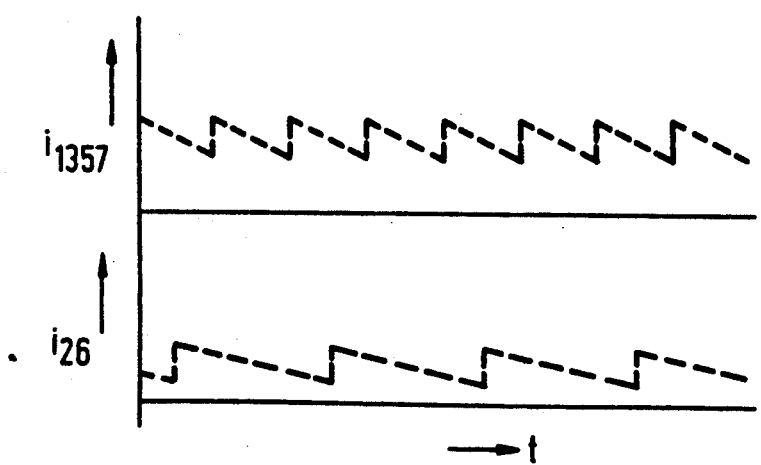

FIGS. 5a, b and c show the same group of calibrated current sources 21 to 28 as in FIG. 4 and the associated spurious signals with like parts bearing the same reference numerals. In the combination means 20 the currents I1, I3, I5 and I7 are now combined to form an output current I1357 at terminal 29, and the currents I2 and I6 are combined to form an output current I26 at terminal 30, a current I4 being obtained at terminal 31. FIG. 5b again shows the individual spurious signals i1 to i8 and the resulting spurious signals i1357 and i26 in the respective output currents I1357 and I26 are shown in FIG. 5c. It is easy to see that the resulting spurious signals are minimized by the selected combination of current sources. The peak-to-peak value of the ripple in the currents I1357 and I26 in the combination shown in FIG. 5a is equal to that of the ripple in the individual currents I1 to I8. This very favourable minimum value is obtained if the average value of the shifts in time of the spurious signals i relative to that of one of the combined currents is equal to half the period Tc and if, in addition, those currents Ii are combined whose spurious signals have a maximal shift in time relative to one another. In FIG. 5b the shifts in time of the spurious signals i3, i5 and i7 relative to i1 are represented by D13, D15 and D17 and have the values 2/8 Tc, 4/8 Tc and 6/8 Tc respectively, so that their average value is $\frac{1}{3}*12/8$ Tc=$\frac{1}{2}$ Tc. The same applies to the time shift of i6 relative to i2, which shift is represented by D26 and is equal to 4/8 Tc=$\frac{1}{2}$ Tc. The spurious signal i1, i3, i5 and i7 moreover have the maximal time shift 2/8 Tc relative to one another. In contrast, the favourable minimum value of the spurious signal is not obtained if the currents I1, I4, I5, I6 are combined to form an output current I1456. In this case the average time shift between the spurious signals i4, i5 and i6 relative to i1 is equal to half the period Tc but the spurious signals i4, i5 and i6 have a smaller shift in time relative to one another than the signals i3, i5 and i7.

For the current-source arrangements shown in FIG. 4 and FIG. 5 it has been demonstrated that for a given calibration sequence such a combination pattern can be obtained in the combination means 20 such that the combined currents exhibit a minimal spurious component. Conversely, i.e. for a given combination pattern, it will be evident that a suitable calibration sequence can be obtained with the same result. In the current-source arrangement shown in FIG. 4 the current sources 21, 22, ..., 28 should then be calibrated in the sequence 21, 25, 22, 27, 23, 26, 24, 28. If the current-source arrangement is of the type shown in FIG. 2 the calibration sequence can be changed by accordingly applying the control signals from the shift register 14 to the switches of the current sources.

Figure 6A:
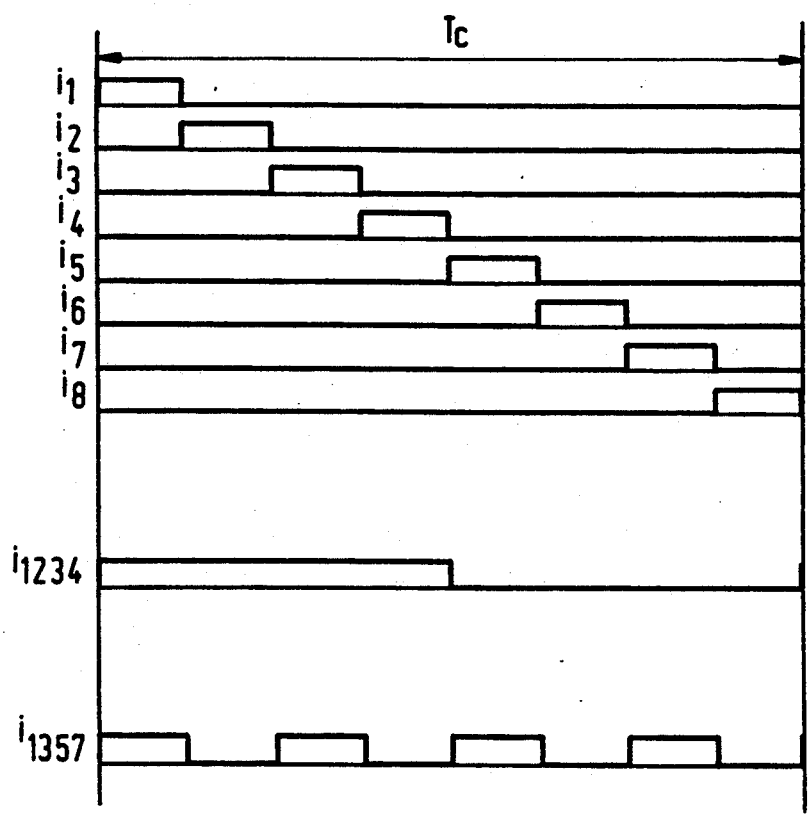
FIGS. 6a-6d show alternative spurious-signal waveforms of calibrated signal sources arranged in accordance with the invention.
Figure 6B:
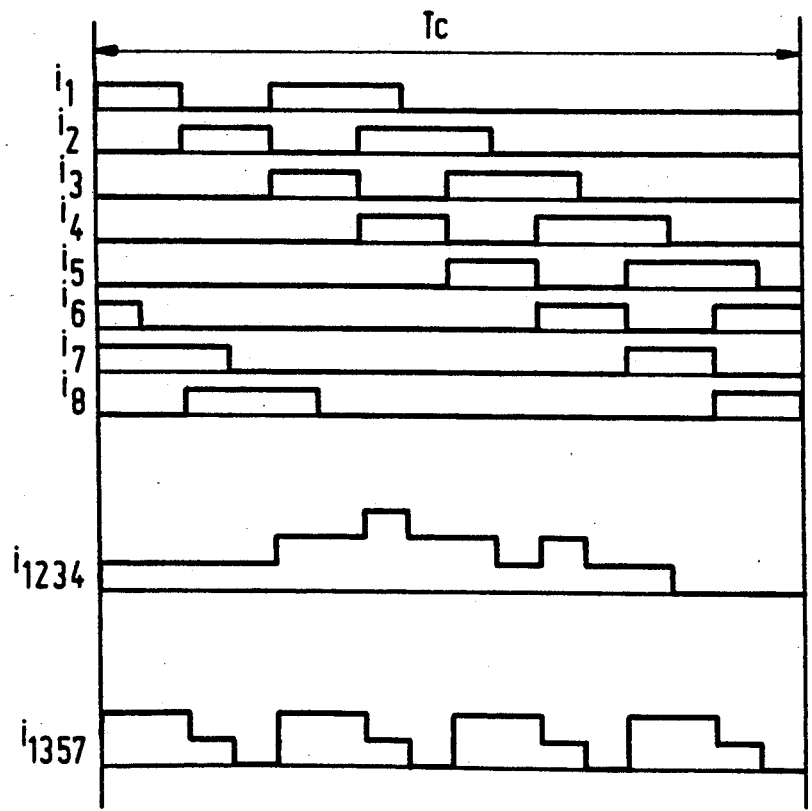
Figure 6C:
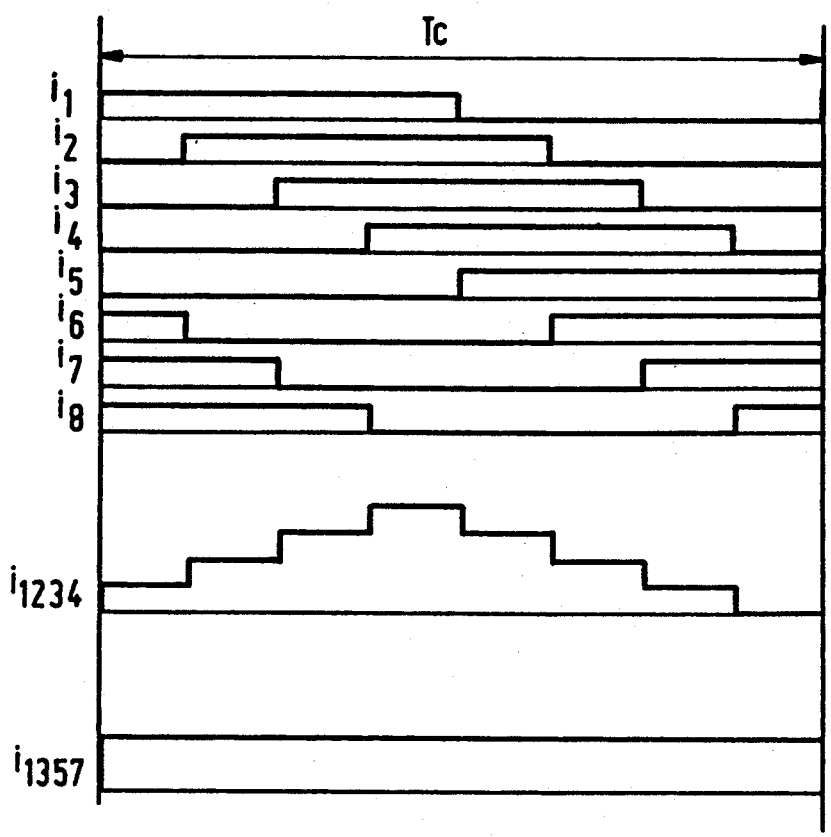
Figure 6D:
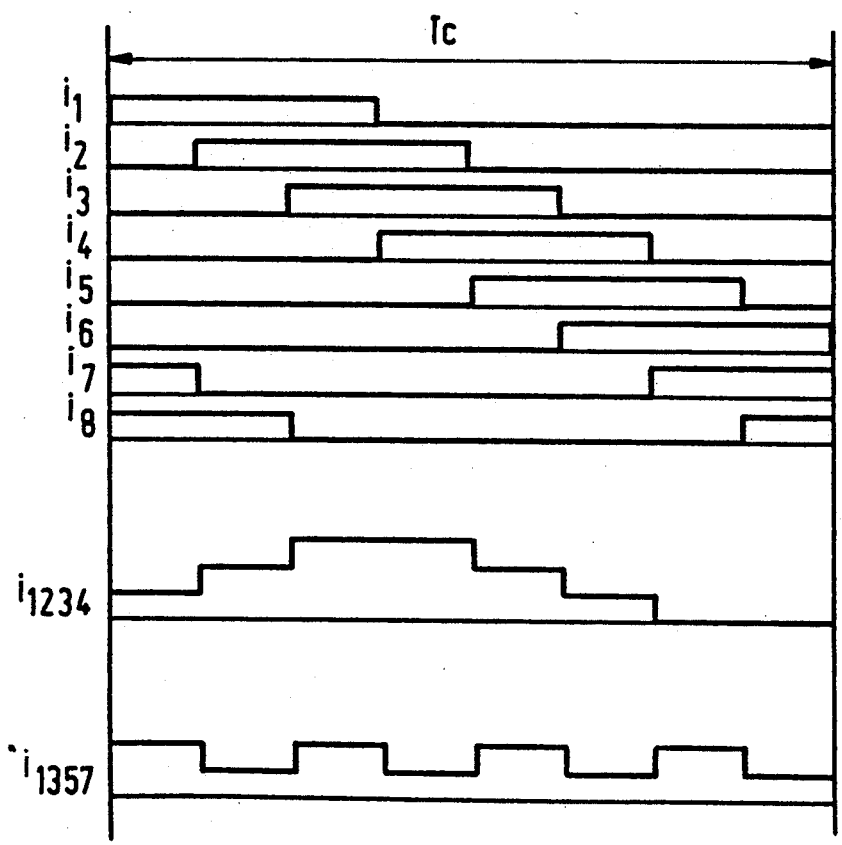

FIGS. 6a, b, c and d by way of example show four other spurious signals i1 to i8 which can occur in the current-source arrangements shown in FIGS. 4a and 5a. The difference between the spurious signal i1234 of the combined currents I1, I2, I3 and I4 and the spurious signal i1357 of the combined currents I1, I3, I5 and I7 is shown for each of the four examples. FIG. 6a shows spurious signals of the type as described with reference to FIG. 3c. The amplitudes of the spurious signals i1234 and i1357 are equal but the repetition rate of the spurious signal i1357 is four times as high as that of i1234. When filters for the output currents are used in order to reject spurious signals, a higher frequency is more favourable because this simplifies filtering of the resulting spurious signal or because, by means of the same filter, a far better suppression of the spurious signal is obtained, yielding a more accurate digital-to-analog converter. In certain cases the quadrupled frequency may even be situated far outside the frequency band of the signal to be processed so that no spurious-signal filters at all are needed. The example shown in FIG. 6b relates to a more complex spurious signal. The amplitudes of the spurious signals i1234 and i1357 are substantially equal but the frequency of the spurious signal in i1357 is four times as high as in i1234. In the example given in FIG. 6c the amplitude of the spurious signal i1357 is constant and in the example given in FIG. 6d the spurious signal i1357 not only has smaller amplitude but also a higher frequency than does i1234.

Figure 7A:
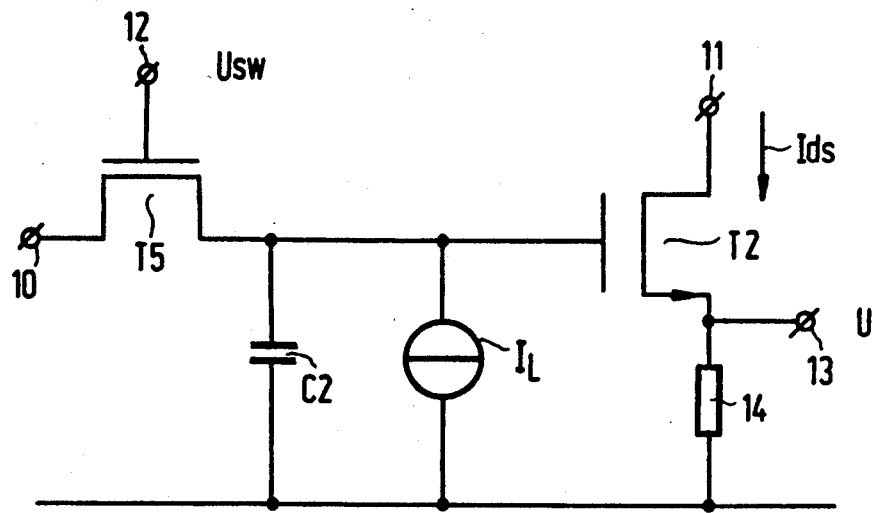
FIGS. 7a-7b show a calibrated voltage source.
Figure 7B:
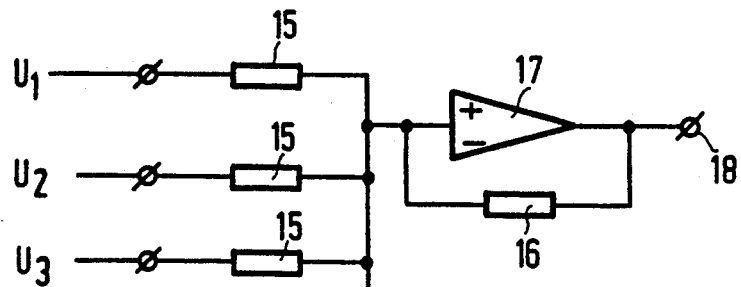

The examples of combinations of spurious signals relate to current sources. It will be evident that the same signal waveforms may also apply to voltage sources. FIG. 7 shows an arrangement comprising voltage sources. The arrangement shown in FIG. 7a is substantially identical to that in FIG. 3a and corresponding reference numerals have the same meanings. A resistor 14 is arranged in series with the source of the transistor T2. The voltage drop across this resistor 14 is proportional to the calibrated current Ids and is available as a unit voltage U on the terminal 13, which is connected to the source of the transistor T2. FIG. 7b shows an adding circuit for combining the unit voltages U1, U2, U3, ... The terminals 13 of the calibrated voltage sources are connected via resistors 15 to the inverting input of an amplifier 17 to which negative feedback is applied by means of a resistor 16 and which has its output connected to the output terminal 18.

The advantageous method of combining calibrated signals, voltages or currents or the advantageous choice of the calibration sequence of the combined signals in order to reduce the resulting spurious signal in the combined signals can be applied to any number of signal sources and any possible combination of signals from the signal sources.

Figure 8A:
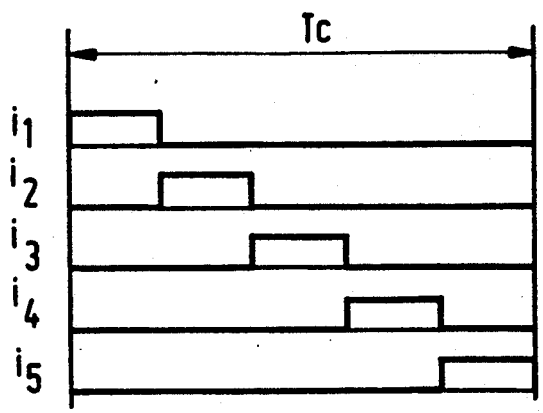
FIGS. 8a-8c show alternative spurious-signal waveforms of calibrated signal sources arranged in accordance with the invention.
Figure 8B:
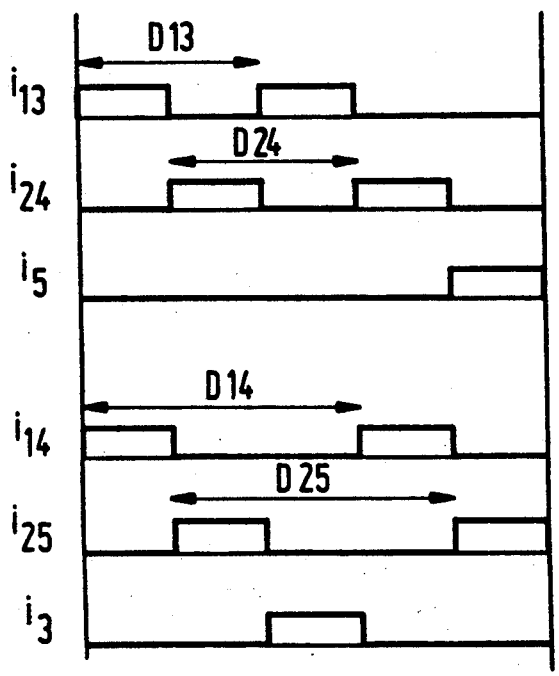
Figure 8C:
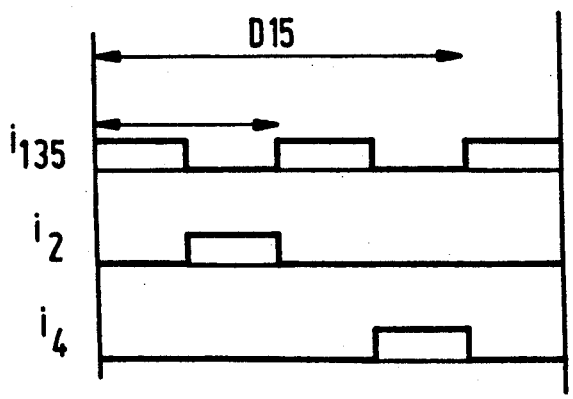

FIG. 8 shows an example comprising five signal sources whose spurious signals i1 to i5 are shown in FIG. 8a. The five sources in FIG. 8b are combined in two ways in the ratio 2:2:1. In FIG. 8c the sources are combined in the ratio 3:1:1. The average value of each of the time shifts D13 and D24 of the signals i13 and i24 in FIG. 8b is 2/5 Tc and is therefore the closest approximation to half the period $\frac{1}{2}$ Tc. The same applies to the time shifts D14 and D25 which have an average value of 3/5 Tc. The average value of the time shifts D13 and D15 in the signal i135 in FIG. 8c is $\frac{1}{2}*6/5=3/5$ Tc and is again an optimal approximation to half the period ½ Tc. In all of the combined signals in the examples shown in FIGS. 8b and 8c the repetition rate is doubled.

Figure 9:
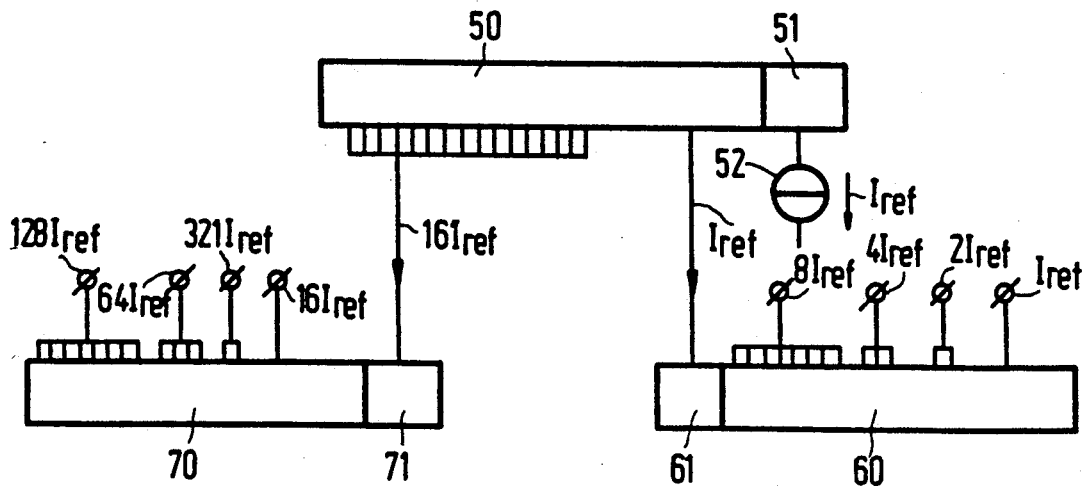
FIG. 9 shows a digital-to-analog converter comprising a current-source arrangement in accordance with the invention.

The combination sequence or calibration sequence as described above is very suitable for use in a digital-to-analog (DA) converter. FIG. 9 shows an embodiment of a D/A converter comprising current-source arrangements in accordance with the invention. The present example is an 8-bit D/A converter. It comprises a current-source arrangement 50, shown diagrammatically, including 18 current sources whose currents are substantially equalized in the above manner to the reference current Iref from a current source 52 in a correction circuit 51. One current Iref of the 18 output currents is used as the reference current for the correction circuit 61 of a second current-source arrangement 60 comprising sixteen current sources, whose currents are made equal to the current Iref in the manner described above. Fifteen of the sixteen currents in the arrangement are combined in such a way that a binary-weighted series of currents Iref, 2Iref . . . 8Iref is obtained. The sixteen other currents from the current-source arrangement 50 are combined to form a current 16Iref, which is applied as the reference current to the correction circuit 71 of a third current-source arrangement 70 comprising sixteen current sources, whose currents are made equal to the current 16Iref in the manner as described above. Again fifteen of the sixteen currents of the current-source arrangement 70 are combined in such a way that a binary-weighted series 16Iref, 32Iref . . . 128Iref is obtained. The output currents of the current-source arrangements 60 and 70 are used in known manner to convert a digital input code into an analog output signal.

In both cases the output currents from the sixteen available current sources I1 to I16 are derived from the currents I1, I3, I5, I7, I9, I11, I13, I15 for the output currents 128Iref and 8Iref; from the currents I4, I8, I12 and I16 for 64Iref and 4Iref; from the currents I2 and I10 for 32Iref and 2Iref, and from the current I6 or the current I14 for 16Iref and Iref. This is effected in a manner similar to that demonstrated for the arrangement shown in FIG. 5a.

The invention is not limited to the embodiments disclosed herein. The correction circuit for the calibration of the signal sources may also be constructed in a manner other than as shown in FIG. 2, various modifications of the current source shown in FIG. 3a and the voltage source shown in FIG. 7a being possible.

We claim:
1. A signal-source arrangement comprising:
a group of signal sources for generating substantially identical unit signals,
correction means for reducing mutual deviations in the unit signals from the signal sources by calibrating the signal sources in conformity with a calibration pattern recurring with a specific period, resulting in unit signals comprising similarly shaped spurious signals recurring with said period and having time shifts in conformity with the calibration pattern,
combination means for combining a number of unit signals of a number of signal sources to form an output signal,
wherein at least one of the correction means and the combination means selects unit signals for the output signal in such a way that, relative to the spurious signal of one of the selected unit signals, the time shifts of the spurious signals of the selected unit signals, except for said one of the selected unit signals, have an average value as closely as possible approximating half of said period and have absolute values that differ from each other to a maximal extent.

2. A signal source arrangement as claimed in claim 1 wherein said correction means further comprises;
a reference signal source, and
switching means for coupling said reference signal source to each of said signal sources in a sequence in accordance with said calibration pattern while simultaneously coupling other ones of the signal sources to an output of the arrangement which supplies said output signal.

3. A signal source arrangement as claimed in claim 1 comprising a plurality of outputs coupled to individual groups of signal sources in a pattern so as to produce output signals at said outputs that are related to one another in a binary order.

4. A signal source arrangement as claimed in claim 1 further comprising;
a reference signal source,
switching means for selectively coupling the reference signal source to the signal sources in a given sequence and for coupling the signal sources to a plurality of outputs of the arrangement, and
a shift register for controlling the operation of said switching means in response to clock signals received by the shift register from a clock signal source.

5. A signal source arrangement comprising:
a plurality of signal sources that produce a plurality of substantially equal unit signals,
means including a reference signal source for calibrating the signal sources in a cyclic calibration pattern having a given period thereby to minimize any inequality between said unit signals, said calibration pattern producing unit signals having similar time shifted spurious signals which recur at said given period,
means for combining a number of said unit signals to produce an output signal with a resultant spurious signal at an output of the arrangement, and
means including at least one of said calibrating means and said combining means for selecting the unit signals so that said spurious signals are relatively shifted in time in a manner so as to minimize the overall effect of said resultant spurious signal on the output signal.

6. A signal source arrangement as claimed in claim 5 for generating a given number of equal unit signals wherein;
the number of signal sources is at least one more than said given number of unit signals, and
each of said signal sources includes a control input switchably coupled to said calibrating means for cyclically adjusting the signal sources in a given pattern and as a function of said reference signal source.

7. A signal source arrangement as claimed in claim 6 wherein said signal sources each include a control transistor having a control electrode coupled to its respective control input.

8. A signal source arrangement as claimed in claim 5 for generating a given number of equal unit signals wherein each of said signal sources comprise an adjustable current source, said unit signals are unit currents, and said reference signal source comprises a reference current, and the number of current sources is at least one more than the given number of unit currents.

9. A signal source arrangement as claimed in claim 5 wherein said signal sources each include a control transistor having a control electrode coupled to said reference signal source via a switching network, and means for operating said switching network so as to couple said reference signal source to individual ones of said control transistors in a cyclic pattern so as to make each unit signal equal to the reference signal.

10. A signal source arrangement as claimed in claim 5 which comprises a plurality of outputs coupled to said signal sources in a pattern such as to produce output signals at said outputs that are related to one another in a binary format.

11. A signal source arrangement as claimed in claim 10 wherein the number of signal sources is at least one more than the number of unit signals produced at an instant of time, and a switching network for coupling the reference signal source to individual ones of the signal sources in a cyclic pattern such that at said instant of time the reference signal source is coupled to one signal source while simultaneously a plurality of said signal sources are coupled to said outputs.

12. A digital/analog converter comprising:

at least one output terminal for summing a plurality of equal unit analog signals determined by a digital input signal, a switching network for selectively coupling a plurality of outputs of a current source arrangement to said output terminal, and wherein said current source arrangement comprises:

a number of outputs coupled to said output terminal for supplying thereto a plurality of selected ones of said equal unit signals, a plurality of unit signal sources for supplying said equal unit signals to said outputs, means including a reference signal source for calibrating the signal sources in a cyclic calibration pattern having a given period thereby to minimize any inequality between said unit signals, said calibration pattern producing unit signals having similar time-shifted spurious signals which recur at said given period, means for combining a number of said unit signals to produce at said outputs equal unit signals each having a resultant spurious signal, and means including at least one of said calibrating means and said combining means for selecting the unit signals so that said spurious signals are relatively shifted in time in a manner so as to minimize the overall effect of said resultant spurious signal on the output signal.

* * * * *